United States Patent
Lee et al.

(10) Patent No.: US 11,552,602 B2
(45) Date of Patent: Jan. 10, 2023

(54) CLASS-D AMPLIFIER WITH HIGH DYNAMIC RANGE

(71) Applicant: MEDIATEK INC., Hsinchu (TW)

(72) Inventors: Fong-Wen Lee, Hsinchu (TW); Wen-Chieh Wang, Hsinchu (TW); Yu-Hsin Lin, Hsinchu (TW)

(73) Assignee: MEDIATEK INC., Hsinchu (TW)

( * ) Notice: Subject to any disclaimer, the term of this patent is extended or adjusted under 35 U.S.C. 154(b) by 3 days.

(21) Appl. No.: 17/227,583

(22) Filed: Apr. 12, 2021

(65) Prior Publication Data
US 2021/0359653 A1 Nov. 18, 2021

Related U.S. Application Data

(60) Provisional application No. 63/023,915, filed on May 13, 2020.

(51) Int. Cl.
*H03F 3/217* (2006.01)
*H03K 19/21* (2006.01)

(52) U.S. Cl.
CPC .............. *H03F 3/217* (2013.01); *H03K 19/21* (2013.01); *H03F 2200/165* (2013.01)

(58) Field of Classification Search
CPC ...... H03F 3/217; H03F 2200/165; H03F 1/26; H03F 3/181; H03F 3/2173; H03F 1/34; H03K 19/21
USPC ........................................ 330/10, 207 A, 251
See application file for complete search history.

(56) References Cited

U.S. PATENT DOCUMENTS

| | | | |
|---|---|---|---|
| 8,159,299 B2* | 4/2012 | Gribben | H03F 1/305 330/251 |
| 9,955,257 B2* | 4/2018 | Zhu | H03F 3/185 |
| 10,476,455 B1 | 11/2019 | Astrachan et al. | |
| 2011/0006843 A1 | 1/2011 | Tanaka et al. | |
| 2011/0068864 A1 | 3/2011 | Putzeys | |
| 2018/0367107 A1 | 12/2018 | Bostrom et al. | |
| 2019/0386626 A1 | 12/2019 | Lesso et al. | |

FOREIGN PATENT DOCUMENTS

| | | |
|---|---|---|
| CN | 109756817 B | 4/2020 |
| EP | 2 375 566 A1 | 10/2011 |

OTHER PUBLICATIONS

Extended European Search Report dated Oct. 1, 2021, issued in application No. EP 21172592.4.
Chinese language office action dated Jun. 23, 2021, issued in application No. TW 110115849.

* cited by examiner

*Primary Examiner* — Hieu P Nguyen
(74) *Attorney, Agent, or Firm* — McClure, Qualey & Rodack, LLP

(57) ABSTRACT

A class-D amplifier with good signal-to-noise ratio (SNR) performance is shown. The class-D amplifier includes a loop filter, a pulse-width modulation signal generator, a gate driver, a power driver, and a feedback circuit, which are configured to establish a closed amplification loop. The feedback circuit is configured to establish a feedback path. The class-D amplifier further includes a feedback breaker. The feedback breaker breaks the feedback path in response to conditions in which there no-signal information in the class-D amplifier.

16 Claims, 4 Drawing Sheets

CLASS-D AMPLIFIER WITH HIGH DYNAMIC RANGE

CROSS REFERENCE TO RELATED APPLICATIONS

This application claims the benefit of U.S. Provisional Application No. 63/023,915 filed on May 13, 2020, the entirety of which is incorporated by reference herein.

BACKGROUND OF THE INVENTION

Field of the Invention

The present invention relates to a class-D amplifier.

Description of the Related Art

A class-D audio amplifier is basically a switching amplifier or a pulse width modulation (PWM) amplifier. In this type of amplifier, the metal-oxide-silicon transistors (MOSs) of the power driver are either fully on or fully off, significantly reducing the power losses in the output stage. A high-efficiency amplification is achieved.

There are several ways to convert analog signals to PWM signals to drive the MOSs of the power driver. To eliminate an output filter, a BD modulation switching technique is developed. According to the BD modulation switching technique, the duty cycle of the difference between two output signals VOP and VON of the class-D amplifier is modulated to make the average content of the amplified result corresponds to the analog input signal. The class-D amplifier is a closed-loop circuit. The larger the analog input signal, the more significant the difference between the two output signals is.

However, there are no-signal information conditions in the BD modulation. For example, (VON, VOP) may be (VDD, VDD) or (GND, GND). Under these no-signal information conditions, noise is fed to the loop although no meaningful signal is in the loop. The signal-to-noise ratio (SNR) is degraded.

Use of class-D amplifiers is common in audio applications. Any small noise fed to the loop in the no-signal information conditions is intolerable for the user. How to deal with the no-signal information conditions is an important issue in the field of class-D amplifiers.

BRIEF SUMMARY OF THE INVENTION

In the present invention, a solution to deal with conditions in which there is no-signal information is proposed.

A class-D amplifier in accordance with an exemplary embodiment of the present invention includes a loop filter, a pulse-width modulation signal generator, a gate driver, a power driver, and a feedback circuit, which are configured to establish a closed amplification loop. The feedback circuit is configured to establish a feedback path. The class-D amplifier further includes a feedback breaker. The feedback breaker breaks the feedback path in response to no-signal information conditions of the class-D amplifier.

In such a design, the signal-to-noise ratio (SNR) performance is significantly improved.

In an exemplary embodiment, an input signal of the class-D amplifier is coupled to the loop filter. The loop filter is coupled to the pulse-width modulation signal generator. The pulse-width modulation signal generator generates a first pulse-width modulation signal and a second pulse-width modulation signal. The gate driver transforms the first pulse-width modulation signal and the second pulse-width modulation signal into control signals. The power driver is controlled by the control signals to drive a load. The feedback circuit is coupled between the power driver and the loop filter to establish the feedback path. In the no-signal information conditions, the first pulse-width modulation signal may equal the second pulse-width modulation signal.

In an exemplary embodiment, the feedback breaker includes a logic circuit and a switch circuit. The no-signal information conditions are detected by the logic circuit. When detecting the no-signal information conditions, the logic circuit outputs a switch signal to switch the switch circuit to break the feedback path.

In an exemplary embodiment, the logic circuit includes an Exclusive-OR gate that receives the first pulse-width modulation signal and the second pulse-width modulation signal to output the switch signal. The logic circuit may be combined into the gate driver.

In an exemplary embodiment, the logic circuit further includes a delay unit, which delays the switch signal according to the response time of the class-D amplifier.

The class-D amplifier may be a differential-in and differential-out amplifier, or a single-ended in and single-ended out amplifier.

A detailed description is given in the following embodiments with reference to the accompanying drawings.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

The following description is made for the purpose of illustrating the general principles of the invention and should not be taken in a limiting sense. The scope of the invention is best determined by reference to the appended claims.

Figure 1:
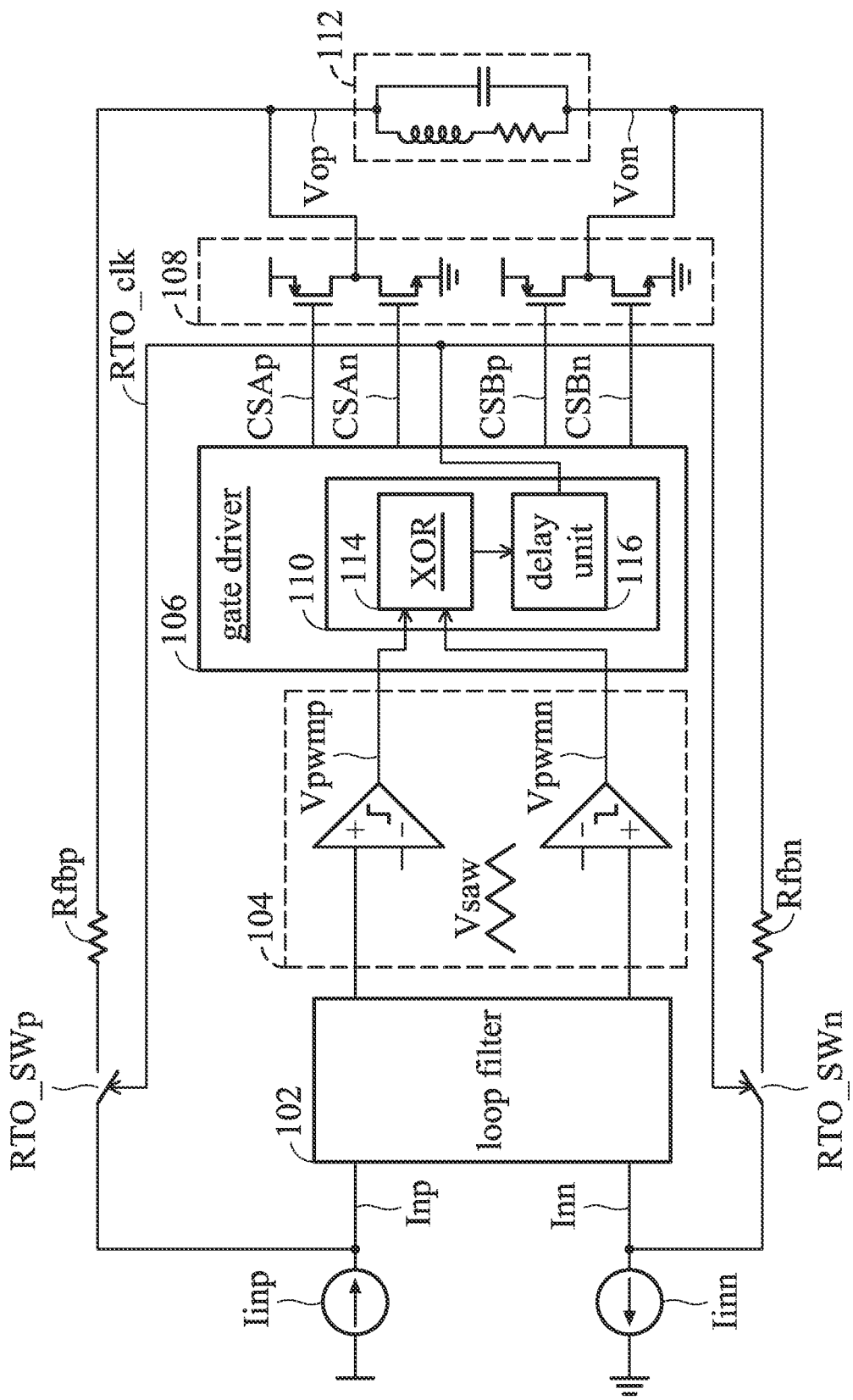
FIG. 1 depicts a class-D amplifier in a differential-in and differential-out architecture in accordance with an exemplary embodiment of the present invention.

FIG. 1 depicts a class-D amplifier in a differential-in and differential-out architecture in accordance with an exemplary embodiment of the present invention. The class-D amplifier includes a loop filter 102, a pulse-width modulation (PWM) signal generator 104, a gate driver 106, a power driver 108, and a pair of feedback resistors Rfbp and Rfbn, which are configured to establish a closed amplification loop. A feedback path in the closed amplification loop is established through the feedback resistors Rfbp and Rfbn. The class-D amplifier further includes a pair of switches RTO_SWp and RTO_SWn, and a logic circuit 110. The logic circuit 110 is operative to detect no-signal information conditions of the class-D amplifier. When detecting the no-signal information conditions, the logic circuit 110 outputs a switch signal RTO_clk to disconnect the feedback resistors Rfbp and Rfbn from the positive input terminal Inp and the negative input terminal Inn of the class-D amplifier, respectively. In this manner, the feedback path of the closed amplification loop is broken in response to the no-signal information conditions of the class-D amplifier. No noise is fed into the signal amplification circuit through the feedback path when no meaningful signal is in the signal amplification circuit. The signal-to-noise ratio (SNR) performance, therefore, is significantly improved.

As shown, an input signal (Iinp, Iinn) of the class-D amplifier is coupled to the loop filter 102. The loop filter 102 is coupled to the PWM signal generator 104. The PWM signal generator 104 generates PWM signals Vpwmp and Vpwmn by comparing the signals from the loop filter 102 with a saw signal Vsaw. The gate driver 106 transforms the PWM signals Vpwmp and Vpwmn into control signals CSAp, CSAn, CSBp, and CSBn. The power driver 108 includes an H-bridge circuit controlled by the control signals CSAp, CSAn, CSBp, and CSBn to drive a load 112. The feedback resistor Rfbp is coupled between a positive output terminal Vop of the class-D amplifier and a positive input terminal Inp of the class-D amplifier. The feedback resistor Rfbn is coupled between a negative output terminal Von of the class-D amplifier and a negative input terminal Inn of the class-D amplifier. In the no-signal information conditions, the PWM signal Vpwmp may equal the PWM signal Vpwmn. For example, in the no-signal information conditions, (VON, VOP) may be (VDD, VDD) or (GND, GND).

As shown, the logic circuit 110 may be combined into the gate driver 106. The logic circuit 110 includes an Exclusive-OR gate 114 and a delay unit 116. The Exclusive-OR gate 114 receives the PWM signals Vpwmp and Vpwmn, and an output terminal of the Exclusive-OR gate 114 is coupled to the delay unit 116. The delay unit 116 provides a delay time according to the response time of the class-D amplifier. In this manner, the switch signal RTO_clk has a proper delay. The feedback path is not broken till all meaningful signals in the amplification circuit have been amplified. The delay unit 116 is an optional device.

In another exemplary embodiment, the Exclusive-OR calculation is performed on the positive output signal Vop and the negative output signal Von rather than the PWM signals Vpwmp and Vpwmn.

Figure 2:
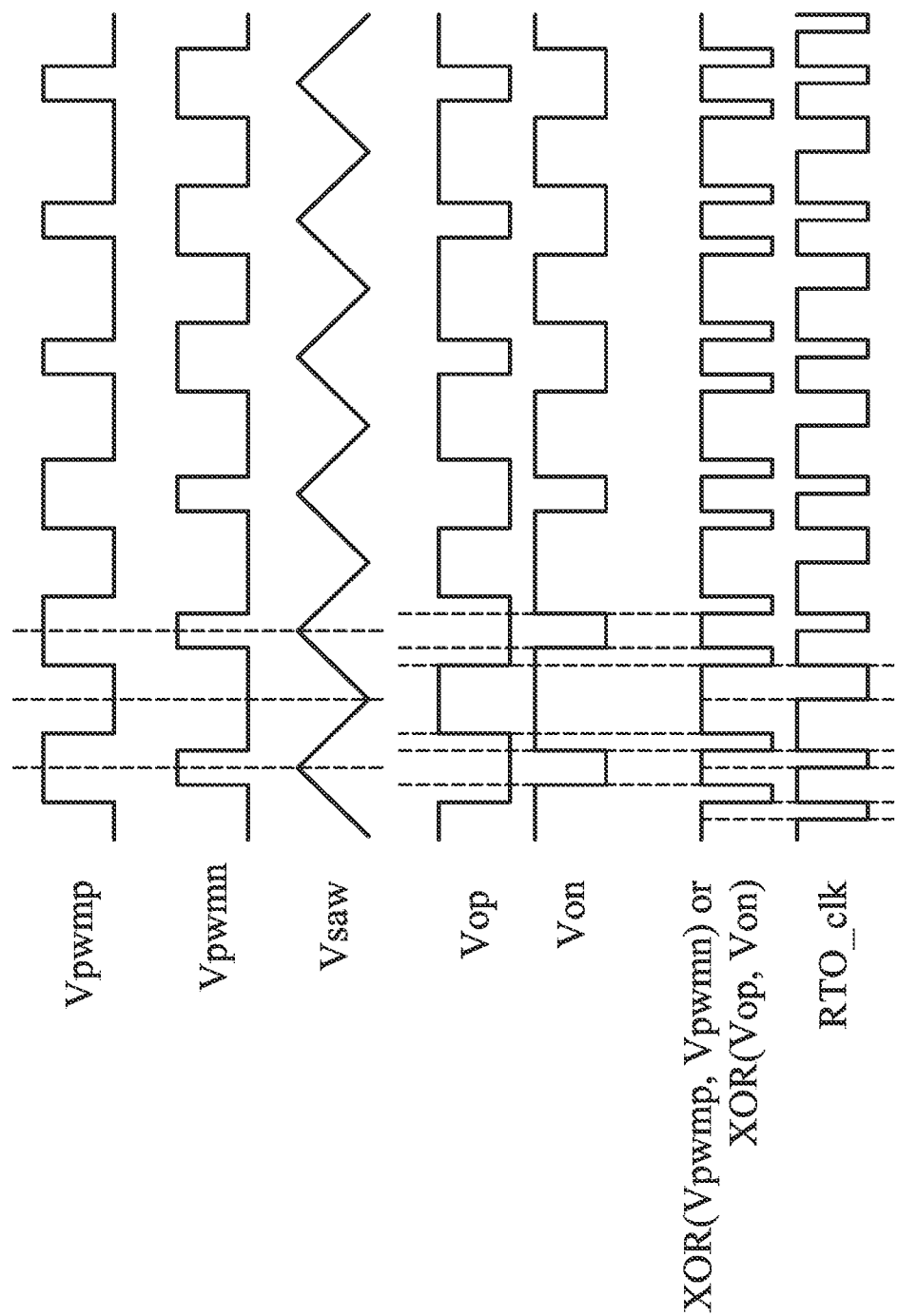
FIG. 2 shows the waveforms of the signals in the class-D amplifier of FIG. 1 in accordance with an exemplary embodiment of the present invention.

FIG. 2 shows the waveforms of the signals in the class-D amplifier of FIG. 1 in accordance with an exemplary embodiment of the present invention.

The status of the PWM signals Vpwmp and Vpwmn is reflected on the positive output signal Vop and the negative output signal Von of the class-D amplifier. In the no-signal information conditions, the PWM signal Vpwmp equals the PWM signal Vpwmn, so that the positive output signal Vop equals the negative output signal Von. According to an Exclusive-OR calculation, XOR(Vpwmp,Vpwmn) or XOR(Vop, Von), the identical status of Vpwmp and Vpwmn is detected. After a delay depending on the response time of the class-D amplifier, the switch signal RTO_clk is generated. When the switch signal RTO_clk is high, the switches RTO_SWp and RTO_SWn are open. The feedback path is broken. Noise is not fed into the signal amplification circuit through the feedback path.

Figure 3:
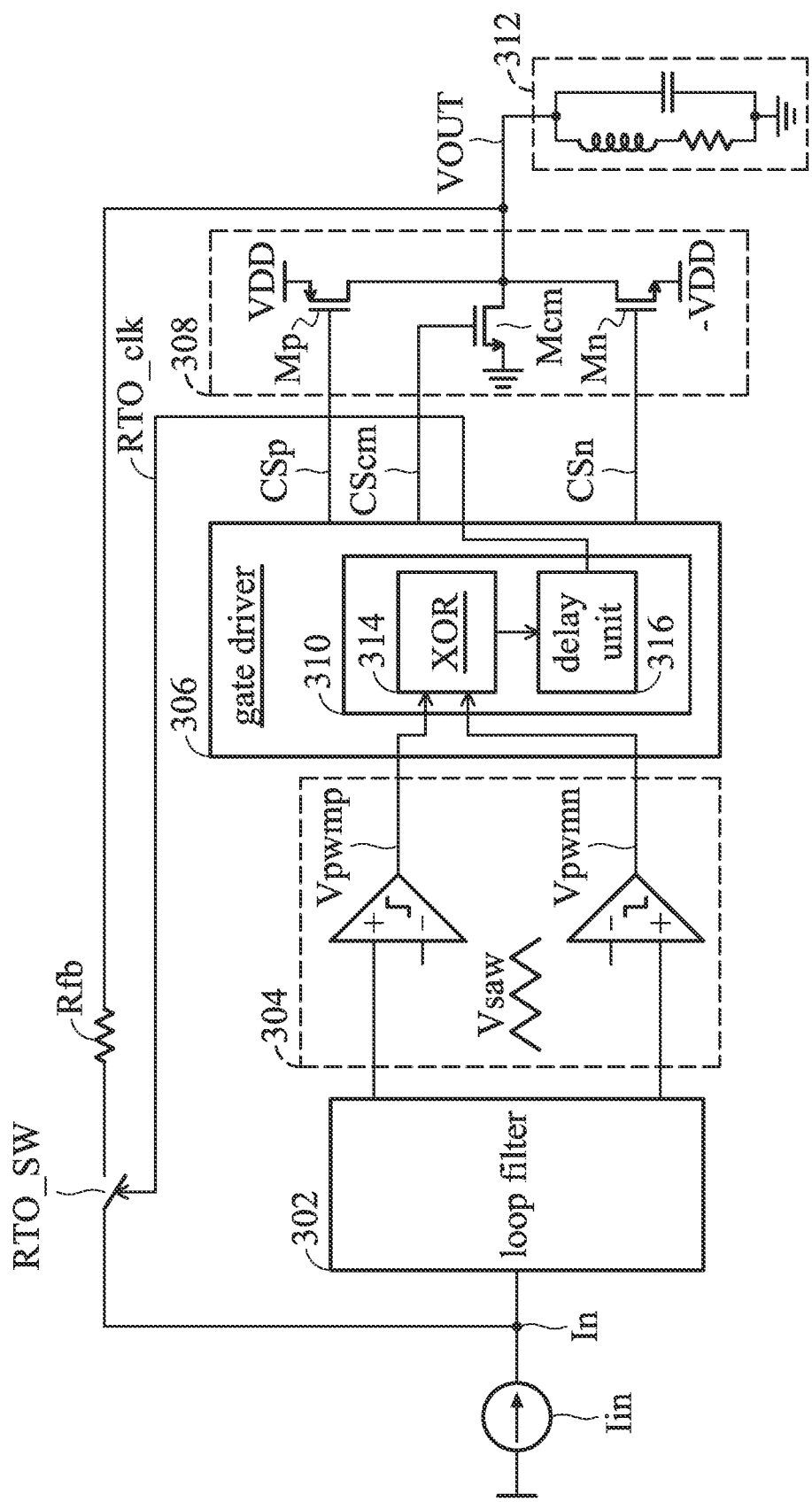
FIG. 3 depicts a class-D amplifier in a single-ended in and single-ended out architecture in accordance with an exemplary embodiment of the present invention.

FIG. 3 depicts a class-D amplifier in a single-ended in and single-ended out architecture in accordance with an exemplary embodiment of the present invention. The class-D amplifier includes a loop filter 302, a PWM signal generator 304, a gate driver 306, a power driver 308, and a feedback resistor Rfb, which are configured to establish a closed amplification loop. A feedback path in the closed amplification loop is established through the feedback resistor Rfb. The class-D amplifier further includes a switch RTO_SW and a logic circuit 310. The logic circuit 310 is operative to detect no-signal information conditions of the class-D amplifier. When detecting the no-signal information conditions, the logic circuit 310 outputs a switch signal RTO_clk to disconnect the feedback resistor Rfb from the input terminal In of the class-D amplifier, respectively. In this manner, the feedback path of the closed amplification loop is broken in response to the no-signal information conditions of the class-D amplifier. No noise is fed into the signal amplification circuit through the feedback path when no meaningful signal is in the signal amplification circuit. The signal-to-noise ratio (SNR) performance, therefore, is significantly improved.

As shown, an input signal Iin of the class-D amplifier is coupled to the loop filter 302. The loop filter 302 is coupled to the PWM signal generator 304. The PWM signal generator 304 generates PWM signals Vpwmp and Vpwmn by comparing the signals from the loop filter 302 with a saw signal Vsaw. The gate driver 306 transforms the PWM signals Vpwmp and Vpwmn into control signals CSp and CSn. The power driver 308 includes transistors Mp, Mn, and Mcm. The transistor Mp is controlled by the control signal CSp and is coupled between a power source terminal (VDD) and an output terminal VOUT of the class-D amplifier. The transistor Mn is controlled by the control signal CSn and is coupled between the output terminal VOUT of the class-D amplifier and a negative power source terminal (−VDD). The transistor Mcm is controlled by the control signal CScm (e.g., asserted when the PWM signals Vpwmp and Vpwmn are at the same value) and is coupled between the output terminal VOUT of the class-D amplifier and a common-mode node (GND) of the class-D amplifier. The power driver 308 drives a load 312. The feedback resistor Rfbp is coupled between the output terminal VOUT of the class-D amplifier and the input terminal In of the class-D amplifier. In the no-signal information conditions, the PWM signal Vpwmp may equal the PWM signal Vpwmn. For example, in the no-signal information conditions, (Vpwmp, PWM) may be (VDD, VDD) or (GND, GND).

As shown, the logic circuit 310 may be combined into the gate driver 306. The logic circuit 310 includes an Exclusive-OR gate 314 and a delay unit 316. The Exclusive-OR gate 314 receives the PWM signals Vpwmp and Vpwmn, and an output terminal of the Exclusive-OR gate 314 is coupled to the delay unit 316. The delay unit 316 provides a delay time according to the response time of the class-D amplifier. In this manner, the switch signal RTO_clk has a proper delay. The feedback path is not broken till all meaningful signals in the amplification circuit have been amplified. The delay unit 316 is an optional device.

Figure 4:
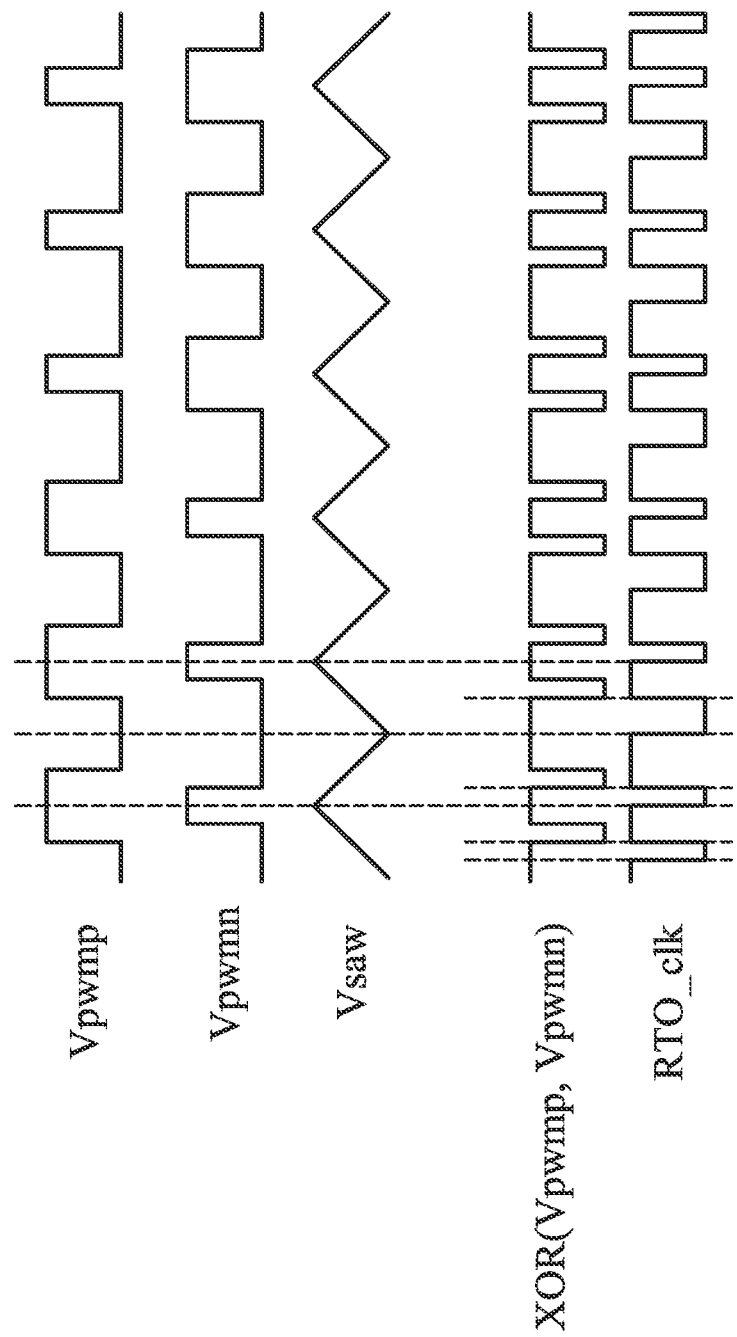
FIG. 4 shows the waveforms of the signals in the class-D amplifier of FIG. 3 in accordance with an exemplary embodiment of the present invention.

FIG. 4 shows the waveforms of the signals in the class-D amplifier of FIG. 3 in accordance with an exemplary embodiment of the present invention.

In the no-signal information conditions, the PWM signal Vpwmp equals the PWM signal Vpwmn, so that the positive output signal Vop equals the negative output signal Von. According to an Exclusive-OR calculation, XOR(Vpwmp, Vpwmn), the identical status of Vpwmp and Vpwmn is detected. After a delay depending on the response time of the class-D amplifier, the switch signal RTO_clk is generated. When the switch signal RTO_clk is high, the switch RTO_SW is open. The feedback path is broken. Noise is not fed into the signal amplification circuit through the feedback path.

There may be various modifications in the class-D amplification circuit. Any class-D amplifier with the following components should be considered within the scope of the present invention. The proposed class-D amplifier includes a loop filter, a pulse-width modulation signal generator, a gate driver, a power driver, and a feedback circuit, which are configured to establish a closed amplification loop. The feedback circuit is configured to establish a feedback path. The proposed class-D amplifier further includes a feedback breaker. The feedback breaker breaks the feedback path in response to no-signal information conditions of the class-D amplifier.

While the invention has been described by way of example and in terms of the preferred embodiments, it should be understood that the invention is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A class-D amplifier, comprising:
a loop filter, a pulse-width modulation signal generator, a gate driver, a power driver, and a feedback circuit, configured to establish a closed amplification loop, wherein the feedback circuit is configured to establish a feedback path; and
a feedback breaker, breaking the feedback path in response to no-signal information conditions of the class-D amplifier,
wherein:
the feedback breaker includes a logic circuit and a switch circuit;
the no-signal information conditions are detected by the logic circuit; and
when detecting the no-signal information conditions, the logic circuit outputs a switch signal to switch the switch circuit to break the feedback path.

2. The class-D amplifier as claimed in claim 1, wherein:
an input signal of the class-D amplifier is coupled to the loop filter;
the loop filter is coupled to the pulse-width modulation signal generator;
the pulse-width modulation signal generator generates a first pulse-width modulation signal and a second pulse-width modulation signal;
the gate driver transforms the first pulse-width modulation signal and the second pulse-width modulation signal into control signals;
the power driver is controlled by the control signals to drive a load; and
the feedback circuit is coupled between the power driver and the loop filter to establish the feedback path.

3. The class-D amplifier as claimed in claim 2, wherein:
in the no-signal information conditions, the first pulse-width modulation signal equals the second pulse-width modulation signal.

4. The class-D amplifier as claimed in claim 3, wherein:
the logic circuit includes an Exclusive-OR gate that receives the first pulse-width modulation signal and the second pulse-width modulation signal to output the switch signal.

5. The class-D amplifier as claimed in claim 4, wherein:
the logic circuit is combined into the gate driver.

6. The class-D amplifier as claimed in claim 4, wherein:
the logic circuit further includes a delay unit, which delays the switch signal according to a response time of the class-D amplifier.

7. The class-D amplifier as claimed in claim 3, which is a differential-in and differential-out amplifier, wherein:
the feedback circuit includes a first feedback resistor coupled between a positive output terminal of the class-D amplifier and a positive input terminal of the class-D amplifier, and a second feedback resistor coupled between a negative output terminal of the class-D amplifier and a negative input terminal of the class-D amplifier; and
the switch circuit includes a first switch operative to disconnect the first feedback resistor from the positive input terminal of the class-D amplifier, and a second switch operative to disconnect the second feedback resistor from the negative input terminal of the class-D amplifier.

8. The class-D amplifier as claimed in claim 7, wherein:
the power driver includes an H-bridge circuit.

9. The class-D amplifier as claimed in claim 8, wherein:
the logic circuit includes an Exclusive-OR gate that receives the first pulse-width modulation signal and the second pulse-width modulation signal to output the switch signal; and
the first switch and the second switch are opened by the switch signal.

10. The class-D amplifier as claimed in claim 9, wherein:
the logic circuit is combined into the gate driver.

11. The class-D amplifier as claimed in claim 9, wherein:
the logic circuit further includes a delay unit, which delays the switch signal according to a response time of the class-D amplifier.

12. The class-D amplifier as claimed in claim 3, which is a single-ended in and single-ended out amplifier, wherein:
the feedback circuit includes a feedback resistor coupled between an output terminal of the class-D amplifier and an input terminal of the class-D amplifier; and
the switch circuit includes a switch operative to disconnect the feedback resistor from the input terminal of the class-D amplifier.

13. The class-D amplifier as claimed in claim 12, wherein the power driver includes a first transistor, a second transistor, and a third transistor controlled by the gate driver, wherein:
the first transistor is coupled between a power source terminal and the output terminal of the class-D amplifier;
the second transistor is coupled between the output terminal of the class-D amplifier and a negative power source terminal; and
the third transistor is coupled between the output terminal of the class-D amplifier and a common-mode node of the class-D amplifier.

14. The class-D amplifier as claimed in claim 13, wherein:
the logic circuit includes an Exclusive-OR gate that receives the first pulse-width modulation signal and the second pulse-width modulation signal to output the switch signal; and
the switch is opened by the switch signal.

15. The class-D amplifier as claimed in claim 14, wherein:
the logic circuit is combined into the gate driver.

16. The class-D amplifier as claimed in claim 14, wherein:
the logic circuit further includes a delay unit, which delays the switch signal according to a response time of the class-D amplifier.

* * * * *